United States Patent
Chien et al.

(10) Patent No.: US 7,937,677 B2
(45) Date of Patent: May 3, 2011

(54) DESIGN-FOR-TEST-AWARE HIERARCHICAL DESIGN PLANNING

(75) Inventors: Hung-Chun Chien, Sunnyvale, CA (US); Ben Mathew, Plano, TX (US); Padmashree Takkars, Portland, OR (US); Bang Liu, Shanghai (CN); Chang-Wei Tai, Los Altos, CA (US); Xiao-Ming Xiong, Fremont, CA (US); Gary K. Yeap, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 423 days.

(21) Appl. No.: 12/123,209

(22) Filed: May 19, 2008

(65) Prior Publication Data

US 2009/0288045 A1 Nov. 19, 2009

(51) Int. Cl.
*G06F 17/50* (2006.01)
(52) U.S. Cl. .......... 716/103; 716/110; 716/119; 716/122
(58) Field of Classification Search ................ 716/5, 8, 716/10, 11, 18, 103, 110, 111, 118, 119, 716/122
See application file for complete search history.

(56) References Cited

U.S. PATENT DOCUMENTS

| 6,173,435 | B1* | 1/2001 | Dupenloup | 716/18 |
| 6,263,483 | B1* | 7/2001 | Dupenloup | 716/18 |
| 6,295,636 | B1* | 9/2001 | Dupenloup | 716/18 |
| 6,421,818 | B1* | 7/2002 | Dupenloup et al. | 716/18 |
| 6,857,110 | B1* | 2/2005 | Rupp et al. | 716/4 |
| 7,100,140 | B2* | 8/2006 | Amundson et al. | 716/11 |

OTHER PUBLICATIONS

Cote et al. "LogicVision's Complete RTL-to-GDS2 Flow", http://www.yieldlearning.com/YLR_technical_papers.php, Feb. 18, 2008, 9 pages.

* cited by examiner

*Primary Examiner* — Sun J Lin
(74) *Attorney, Agent, or Firm* — Bever, Hoffman & Harms, LLP; Jeanette S. Harms

(57) ABSTRACT

Full-chip scan data can be advantageously used during design planning to minimize top-level scan wires and scan feedthroughs. The scan cells can be reordered using a modified cost function to promote connecting all scan cells in one plan group before crossing to a scan cell in another plan group. The modified cost function can take into account penalty parameters. The penalty parameters can include at least one of: membership in a plan group or a top-level physical hierarchy, size of a plan group, FLOATING/ORDERED scan element in scan data, location of endpoints of an ORDERED list, location of endpoints of a macro, and membership in a plan group containing a STOP point. Scan data, at the block-level and at the top-level, can be automatically updated to reflect the plan groups and optimized scan chains.

24 Claims, 18 Drawing Sheets

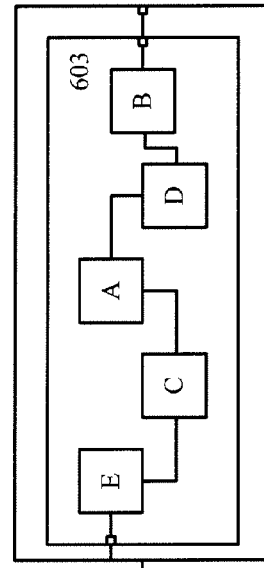
FIG. 6
Prior Art
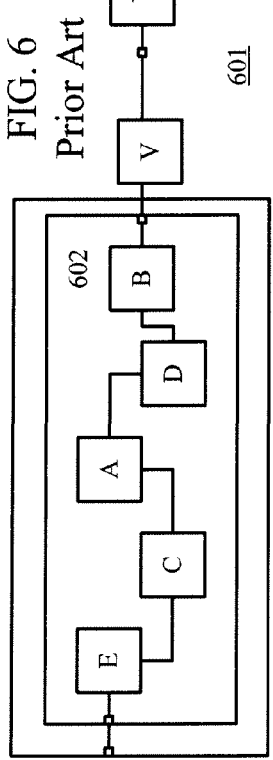
FIG. 7A
Prior Art
```
DESIGN Block1 ;                     701
SCANCHAINS 1 ;
-block_chain1
+START PIN test_si 1
+FLOATING
E ( IN TI) (OUT SO)
C ( IN TI) (OUT SO)
A ( IN TI) (OUT SO)
D ( IN TI) (OUT SO)
B ( IN TI) (OUT SO)
+ PARTITION Clk_45_45
+ STOP PIN test_so1 ;
```
FIG. 7B
Prior Art
```
DESIGN Chip ;                       702
SCANCHAINS 1 ;
-top_chain1
+START pad0 Z
+FLOATING
Block1 ( IN test_si1 ) (OUT test_so1) (BITS 5)
V ( IN TI) (OUT SO)
U ( IN TI) (OUT SO)
Block2 ( IN test_si1 ) (OUT test_so1) (BITS 5)
+ PARTITION Clk_45_45
+ STOP pad1 A;
```

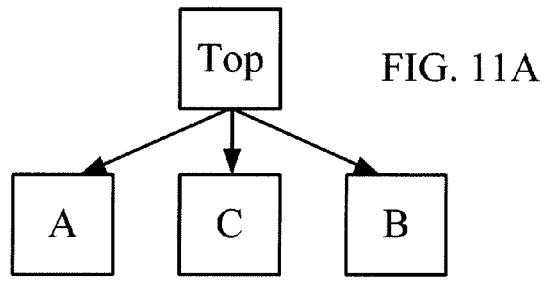
FIG. 11A
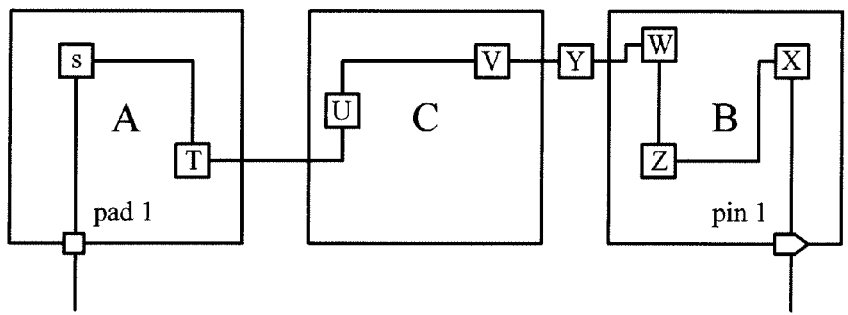
FIG. 11B
```
DESIGN Top1 ;            1102
  SCANCHAINS 1 ;
  -block_chain1
   +START pad1 out
   +FLOATING
    A/S ( IN TI) (OUT SO)
    A/T ( IN TI) (OUT SO)
    C/U ( IN TI) (OUT SO)
    C/V ( IN TI) (OUT SO)
    Y ( IN TI) (OUT SO)
    B/W ( IN TI) (OUT SO)
    B/Z ( IN TI) (OUT SO)
    B/X ( IN TI) (OUT SO)
   + PARTITION Clk_45_45
   + STOP pin1 in ;
```
FIG. 11C

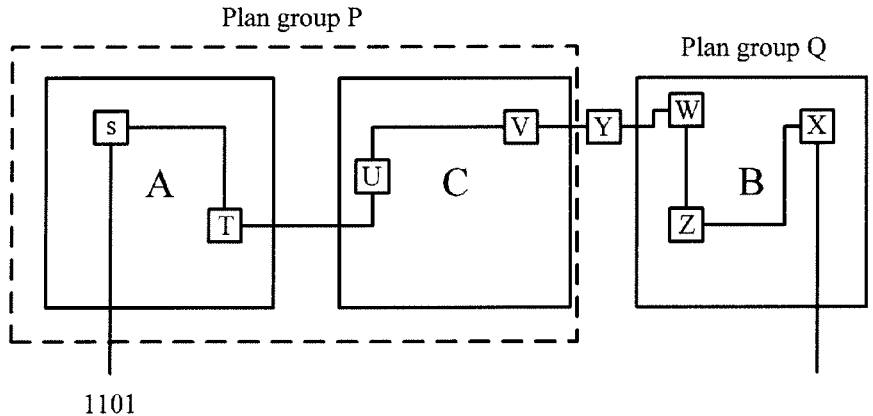

DESIGN Q ;                    1802
SCANCHAINS 1 ;
-block_chain1
+START PIN B/W/SO
+FLOATING
B/Z ( IN TI ) (OUT SO )
+ PARTITION Clk_45_45
+ STOP B/X/TI ;

DESIGN P ;                    1801
SCANCHAINS 1 ;
-block_chain1
+START PIN A/S/SO
+FLOATING
A/T ( IN TI) (OUT SO)
C/U ( IN TI) (OUT SO)
+ PARTITION Clk_45_45
+ STOP C/V/TI ;

FIG. 18B

DESIGN TOP ;                  1803
SCANCHAINS 1 ;
-block_chain1
+START pad1/out
+FLOATING
P ( IN TI1) (OUT SO1) (BITS 4)
Y ( IN TI) (OUT SO) (BITS 1)
Q ( IN TI2) (OUT SO2) (BITS 3)
+ PARTITION Clk_45_45
+ STOP pad2/in ;

FIG. 18D

```
                                    1904
DESIGN TOP ;

SCANCHAINS 1 ;

- block_chain

+ START PIN si_port1

+ FLOATING

E/W ( IN TI ) ( OUT SO )

F/Z ( IN TI ) ( OUT SO )

+ ORDERED E/X (IN SI) (OUT Q)

F/Y (IN A) (OUT Z)

+ PARTITION Clk_45_45

+ STOP PIN so_port1 ;
```

```
DESIGN E ;                          1912
SCANCHAINS 1 ;
- block_chain
+ START PIN si_port1
+ FLOATING
  W ( IN TI ) ( OUT SO )
+ PARTITION Clk_45_45
+ STOP X SI ;
```

```
DESIGN F ;                          1913
SCANCHAINS 1 ;
- block_chain
+ START Y Z
+ FLOATING
  Z ( IN TI ) ( OUT SO )
+ PARTITION Clk_45_45
+ STOP PIN so_port 1 ;
```

DESIGN-FOR-TEST-AWARE HIERARCHICAL DESIGN PLANNING

BACKGROUND OF THE INVENTION

1. Field of the Invention

The present invention relates to scan cells that are used to test a digital integrated circuit (IC) and in particular to using DFT-aware design planning information to optimize top-level scan wires and scan feedthroughs during design planning and then automatically update block-level and top-level scan chain information.

2. Related Art

In general, both logical and physical design tools can be used to create a physical design for an IC. Logical tools can determine the logic necessary to implement the desired functionalities of the IC. Physical design tools can place that logic on the IC in a manner that optimizes chip area and performance. Logical tools are only aware of logical hierarchy. Current physical design tools are aware of logical hierarchy and physical hierarchy. Both the logical and physical design tools use significant resources (e.g. memory and CPU time).

One way to reduce the resources used by the physical design tools is to take advantage of physical hierarchy, i.e. the arrangement of blocks, macros (i.e. design entities for which the physical design is already complete and the existing physical geometries are not modified), etc. on the chip. For example, it is well known that a logical block, once designed, can be used multiple times in a device. Using physical hierarchy, that block can then be copied and pasted over the chip as needed. Physical hierarchy also allows design work to be split up between multiple engineers (or engineering groups). That is, after a design is divided up into different functional areas, engineers can work on their respective blocks. Physical hierarchy also tries to minimize connections between the multiple blocks to optimize design characteristics, such as routability, timing, area, and power. Thus, physical hierarchy can be used to optimize time and resources.

FIG. 1 illustrates a conventional design planning and physical design technique 100 for creating a physical design (wherein this physical design can then be used to make a mask for the IC). In technique 100, the term "plan group" refers to an intended physical partition on the chip that includes a group of design elements. After design planning is complete, each plan group is formally designated a "block". Thus, in reference to FIG. 1 and any associated conventional art, the terms "plan group" and "block" can be used interchangeably. Note that a chip design typically includes hundreds of blocks, wherein each block includes various combinational and sequential logic elements.

In step 101, the plan groups/blocks can be created. In step 102, any standard cells (e.g. less complex elements) and any macro cells (e.g. more complex elements) can be placed in a two-dimensional area representing the IC. In step 103, the plan groups can be shaped and placed in the same 2D area. For example, FIG. 2 illustrates an exemplary IC layout 200 that includes multiple plan groups 201 placed among macros 202 (e.g. memory or analog blocks).

Referring back to FIG. 1, in step 104, the power network for the plan groups and macros can be created. In step 105, the drivers that drive long wires in the plan groups and macros can be checked for strength and swapped for stronger drivers, if necessary. Additionally, clocks for the blocks and macros can be planned at this point. In step 106, wires connecting the design components are routed along approximated paths ("global route"). Next, the pin assignments at the edges of the plan groups (to connect the plan groups to other plan groups, macros, and/or pads of the IC) and any feedthroughs can be created. A feedthrough is a wire that traverses a plan group solely to provide communication between two other floorplan entities (e.g. plan groups, macros, pads, etc). For example, FIG. 3 illustrates a feedthrough 304 that traverses a plan group 302 to connect elements in plan groups 301 and 303, thereby facilitating their communication.

In step 107, the plan group level timing constraint files can be generated (i.e. an allocation of maximum time for each plan group based on the context of all placed plan groups).

Because the design of integrated circuits (ICs) is becoming increasingly complex, it is highly desirable to include testability in all stages of the design process. To facilitate testing of an actual IC, scan cells can be added at the block- and top-level. For example, FIG. 4A illustrates an exemplary block 400 that can include various interconnected combinational logic 401 and sequential elements (e.g. flip-flops or latches) 402. FIG. 4B illustrates block 400 as modified to include scan cells. Specifically, a plurality of logical multiplexers 410 have been provided, wherein a scan enable signal on wire 412 (only one shown for simplicity) can control which of its two inputs is selected as an output. Each multiplexer 410 can provide its output to an input terminal of a sequential element 402. A logical multiplexer 410 and its corresponding sequential element 402 can form a scan cell.

Note that in other embodiments, a scan cell can include multiple sequential logic elements. Further note that in other embodiments, scan cells can include components providing the equivalent to logical multiplexers 410 and sequential elements 402. For example, in one embodiment, scan cells can include sequential elements having a functional clock as well as a test clock (and no scan-enable). Thus, the use of scan cells including logical multiplexers is illustrative only and not limiting to the discussion herein.

One input terminal of logical multiplexer 410 can receive the input that would otherwise be provided to the input terminal of the sequential 402. The other input terminal of each multiplexer 410 can be connected to a wire 411 (shown as a dotted wire for convenience) that can facilitate forming a chain of only sequential elements 402 (and allow bypassing any combinational logic 401). This configuration allows test values to be quickly loaded into sequential elements 402. After loading the test values, then inputs from the other input terminals of multiplexers 410 can be selected (using scan enable wire 412). At this point, the test values can be applied to combinational logic 401 and then clocked to a scan output for analysis.

Notably, after chip testing is complete, multiplexers 410 and wires 411 are not needed for the functionality of the chip. Therefore, although scan cells are necessary to provide chip testability, their presence on the chip is otherwise a liability. For example, wires 411 can significantly contribute to congestion on the chip. In general, the order of the scan cells in the shift path can be changed with no impact on the test quality. However, current tool sets cannot take advantage of this flexibility, as explained below.

FIG. 5 illustrates an exemplary chip design tool set 500 including a logical synthesis tool 502, a design planning tool 505, and a physical design tool 506. Logical synthesis tool 502 can generate a netlist (i.e. a comprehensive listing of all components in the design and their interconnection), inserts scan chains (i.e. scan cells and their interconnections) into the netlist, and then outputs a design-for-test (DFT)-inserted netlist (i.e. the netlist with inserted scan chains) 503 and SCANDEF (i.e. the SCANCHAINS section of the DEF format used by the industry) data 504 (i.e. a first set of scan data for all blocks and a second set of scan data at the top-level)

504. Because logical synthesis tool 502 is unaware of any physical hierarchy this tool can be characterized as a logical hierarchy tool. Design planning tool 505 receives DFT-inserted netlist 503 and SCANDEF 504 to perform scan cell reordering, if desired, and output an updated DFT-inserted netlist 506 to physical design tool 507.

Note that the use of the term "tool" may or may not refer to a single executable. For example, tools 502, 505, and 507 could each include a set of commands forming a single executable used by a computer. In other embodiments, tools 502, 505, and 507 could comprise two or more executables.

Physical design tool 507, which is a physical hierarchy tool, does not have the ability to distinguish scan cells from other components in DFT-inserted netlist 503. However, SCANDEF 504 can advantageously identify those scan cells for physical design tool 507. Therefore, physical design tool 507 can use updated DFT-inserted netlist 506 in combination with SCANDEF 504 to generate and output a physical design 508. At this point, physical design 508 can be converted into a mask design for fabrication.

Note that SCANDEF 504 only describes scan cells that can be reordered (described in data as FLOATING, for example) and any constraints on such reordering. Exemplary constraints can include clocks (described in data as PARTITION), clock edges, power domains, and/or voltages that limit reordering of certain scan cells. Other designated FLOATING scan cells can be constrained to be in a certain order (described in data as ORDERED). DFT-inserted netlist 503, although not able to specifically identify scan cells, does include all scan cells.

For clarification, further note that from the perspective of a tester, a "scan chain" starts and ends at a chip pad. However, in one embodiment, that "scan chain" can include many scan chains that are sequentially connected, wherein these connected scan chains form a pad-to-pad path. Additionally, particularly in pad-limited designs, one internal connection point of a scan chain (i.e. a pin) may actually selectively connect to multiple scan chains (i.e. a fan-out), wherein at some point downstream, these multiple scan chains selectively connect to another internal connection point (i.e. a fan-in). For simplicity herein, a scan chain at the block-level starts and stops with pins, whereas a scan chain at the top-level starts and stops with pads. However, as noted above, this is merely illustrative and not limiting (e.g. a scan chain at the block-level could start with a pad and end with a pin; and a scan chain at the top-level could start and end with pins).

For example, FIG. 6 illustrates a scan chain 601 traversing two blocks 602 and 603 and including top-level scan cells V and U. Each of blocks 602 and 603 includes scan cells E, C, A, D, and B. FIG. 7A illustrates scan data 701 that describes either of blocks 602 and 603 as shown in FIG. 6. FIG. 7B illustrates top-level scan data 702 that includes blocks 602 (e.g. Block1) and 603 (e.g. Block2) as well as top-level scan cells V and U as shown in FIG. 6.

In the scan data of FIGS. 7A and 7B, FLOATING indicates that the designated scan cells (i.e. E, C, A, D, and B) in that block can be reordered. PARTITION indicates a constraint (in this case a clock (Clk) constraint), wherein if two blocks have the same PARTITION designator, then scan cells from the two blocks can be swapped. Further note that for the top-level scan data 702, the blocks simply indicate the number of scan cells (e.g. BITS 5)(rather than identifying individual scan cells), the input pins (e.g. IN test_s1), and the output pin (e.g. OUT test_sol).

Referring back to FIG. 5, assuming that design planning tool 505 changes the order of some scan cells, then SCANDEF 504 and updated DFT-inserted netlist 506 do not correspond. Notably, without such correspondence, physical design tool 507 may make many sub-optimal decisions. Alternatively, a user could manually modify SCANDEF 504 to reflect the modifications made by design planning tool 505. However, this alternative is not commercially viable (or perhaps not even physically possible in complex designs). In another alternative, the logic hierarchy can be changed in logic synthesis tool 502 to match the desired physical hierarchy. However, this alternative is tedious and prone to error, and thus is typically discouraged. Finally, and most probably, the user can opt to leave the physical hierarchy to be substantially similar to the logical hierarchy. That is, in effect, the updated DFT-inserted netlist 506 is ignored and DFT-inserted netlist 503 can instead be provided to physical design tool 507 (see dotted line). Unfortunately, this alternative can result in sub-optimal connections of the scan chains at the top-level of the physical hierarchy.

Therefore, a need arises for a design planning tool that can use DFT-aware design planning information to optimize top-level scan wires and can then automatically update block-level and top-level scan chain information.

SUMMARY OF THE INVENTION

A method of performing DFT-aware design planning can advantageously facilitate automatic updates to scan data, thereby significantly improving resource management. In this method, a DFT-inserted netlist for an integrated circuit (IC) as well as full-chip scan data for scan chains of the IC can be read. Floorplanning on the IC can be performed using the DFT-inserted netlist. Then, plan groups can be created, placed, and shaped based on the results of the floorplanning.

Notably, full-chip scan data can be used to modify the order of scan cells to minimize top-level scan wires and scan feedthroughs. Minimizing top-level scan wires also minimizes the scan ports created on the blocks. This reduces the number of times a scan chain crosses a block boundary. Eliminating unnecessary ports avoids wasted routing resources in connecting the scan chain components to each other. After such minimizing, a DFT-aware design planning tool can automatically update both block-level scan data and top-level scan data. Using the block-level scan data and the DFT-inserted netlist, cells in the blocks can be placed, clock tree synthesis (CTS) can be performed, and routing between the cells can be created. Note that CTS includes clock distribution, clock balancing, and clock buffering. Then, using the top-level scan data and the DFT-inserted netlist, blocks and top-level cells can be placed, clock tree synthesis (CTS) can be performed, and routing between the blocks and top-level cells can be created. Finally, a physical design can be output Minimizing top-level scan wires and scan feedthroughs can include beginning at a starting point of a scan chain. Then, a determination can be made as to whether another unvisited scan cell in the scan chain exists. If so, then a distance from a source scan cell to all unvisited scan cells in the scan chain can be computed in light of one or more penalty parameters. The unvisited scan cell with the shortest distance can then be visited. This process can be repeated for a plurality of scan cells up to the point when all scan cells in the scan chain have been visited. The scan cells of other scan chains can be reordered in a similar manner. Minimizing of the top-level scan wires and scan feedthroughs can further include automatically updating the block-level and top-level scan data as reflected by the now optimized scan chains.

Notably, the penalty parameters can include at least one of: membership in a plan group or a top-level physical hierarchy, size of a plan group, classification of scan elements as FLOATING or ORDERED in scan data, location of endpoints of an ORDERED list, location of endpoints of a macro, the size of the IC and membership in a plan group that includes a STOP point.

For example, when the source scan cell (i.e. the last-visited scan cell) is in a first plan group and an unvisited scan cell is in the first plan group, then the distance can be an actual distance between the source scan cell and the unvisited scan cell. However, when the source scan cell is in a first plan group and an unvisited scan cell is not in the first plan group, then the distance can be an actual distance between the source scan cell and the unvisited scan cell plus a penalty, wherein the penalty is a fraction of a perimeter of the first plan group. In one embodiment, this fraction is ½. Note that when the source scan cell and an unvisited scan cell are in the top-level physical hierarchy, then the distance can be an actual distance between the source scan cell and the unvisited scan cell.

In another example, when the source scan cell is in a first plan group and an unvisited scan cell is a first scan cell of an ORDERED list of scan cells located in the first plan group, then the distance can be an actual distance between the source scan cell and the unvisited scan cell plus a penalty, wherein the penalty is a fraction of a second distance between the first scan cell and a last scan cell of the ORDERED list. In one embodiment, the fraction is ½. As another example, when the source scan cell is in a first plan group and an unvisited scan cell forms a first scan cell of an ORDERED list, then the distance can be an actual distance between the source scan cell and the unvisited scan cell plus a penalty when the first scan cell and/or a last scan cell in the ORDERED list are not in the first plan group.

In another example, when the source scan cell is in a first plan group and an unvisited scan chain element is a macro including an embedded scan chain, the macro being located in the first plan group, then the distance can be an actual distance between the source scan cell and a scan input of the macro plus a penalty, wherein the penalty is a fraction of a second distance between the scan input and a scan output of the macro. In another example, when the source scan cell is in a first plan group and an unvisited scan chain element is a macro including an embedded scan chain, the macro being located in a second plan group, then the distance can be an actual distance between the source scan cell and a scan input of the macro plus a penalty, wherein the penalty is a fraction of the sum of the perimeters of both plan groups.

In one embodiment, a computer-readable medium storing computer-executable instructions is provided for performing DFT-aware design planning, wherein such instructions when executed by a computer can perform the above-described steps.

BRIEF DESCRIPTION OF THE FIGURES

FIG. 6 illustrates a scan chain that traverses two blocks and includes top-level scan cells.

FIG. 7A illustrates the block-level scan data of FIG. 6.

FIG. 7B illustrates top-level scan data for FIG. 6.

FIG. 11A illustrates a simple top-level hierarchy including multiple blocks.

FIG. 11B illustrates scan cells of a scan chain that traverses the blocks of FIG. 11A.

FIG. 11C illustrates full-chip scan data including designators for blocks and scan cells as well as top-level scan cells.

FIGS. 18A, 18B, 18C, and 18D illustrate exemplary plan groups that can be formed and how those plan groups can be reflected in automatically-generated block-level scan data and top-level scan data.

DETAILED DESCRIPTION OF THE FIGURES

Current design planning typically results in the physical hierarchy being the same as the logical hierarchy. This enforced correspondence can cause sub-optimal physical design because logical connections are generally not physically friendly, e.g. an excessive number of top-level scan wires and feedthroughs. Thus, current design planning needs improvement.

In accordance with one feature of a DFT-aware design planning technique, full-chip scan data can be used to minimize top-level scan wires and feedthroughs. Corresponding block-level and top-level scan data can be advantageously updated automatically. Therefore, as explained in more detail below, a DFT-aware design planning technique can provide significant improvements in tool and resource efficiency.

Figure 1:
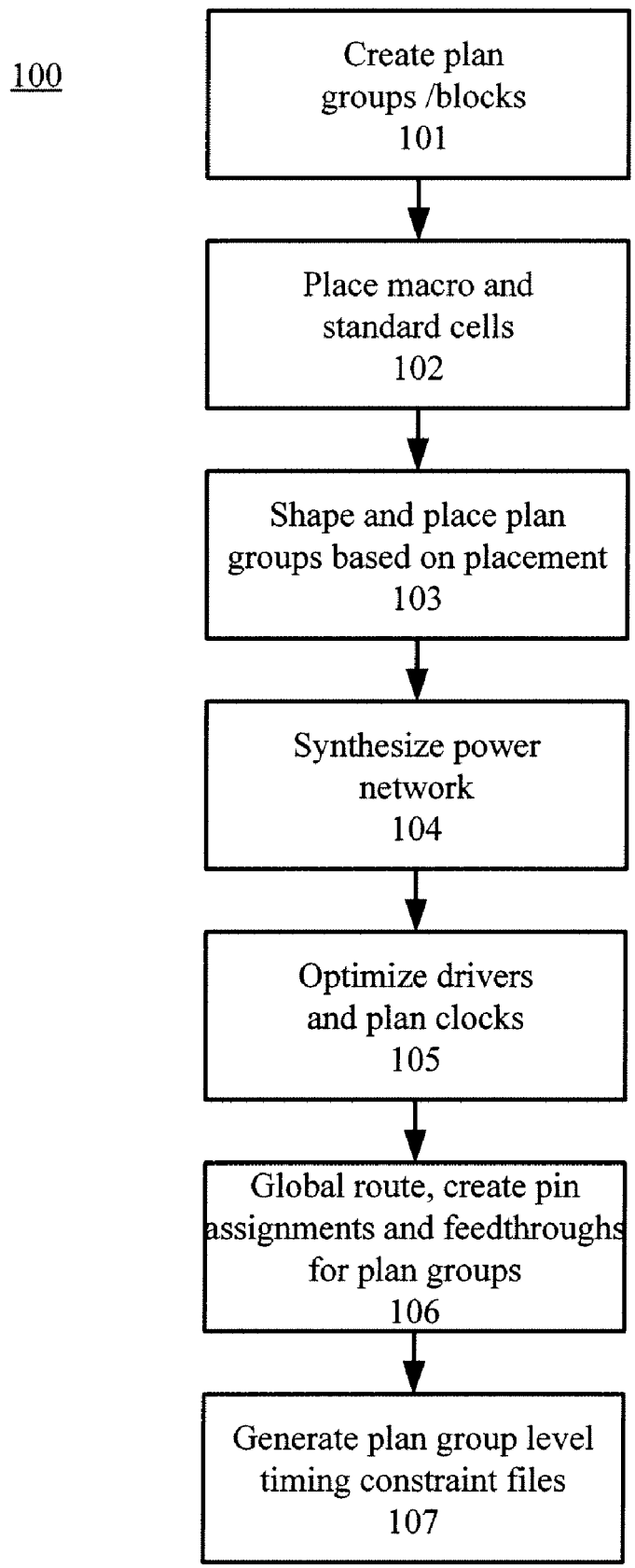
FIG. 1 illustrates a conventional design planning technique for creating a physical design
Figure 2:
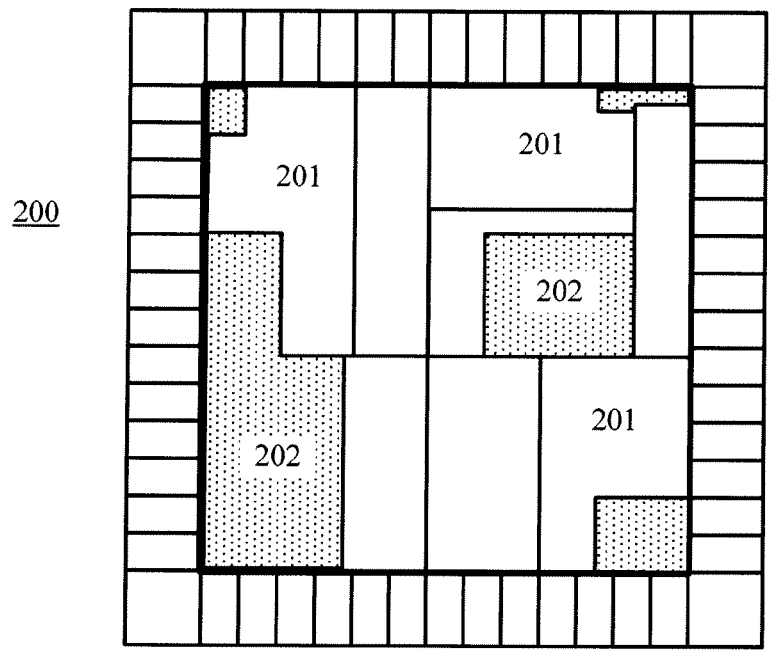
FIG. 2 illustrates an exemplary IC layout that includes multiple plan groups and macros.
Figure 3:
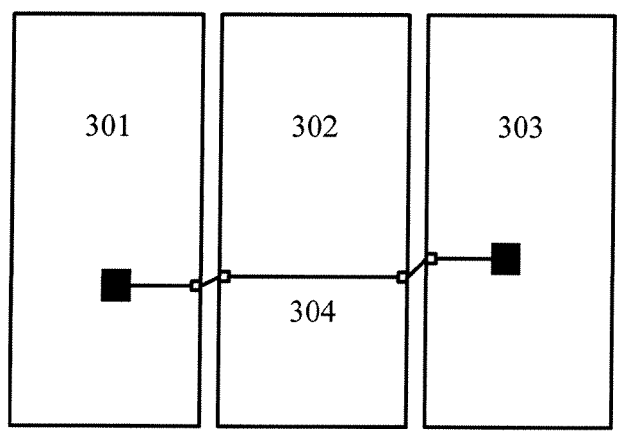
FIG. 3 illustrates a scan feedthrough that traverses a plan group to connect scan elements in adjacent plan groups.
Figure 4A:
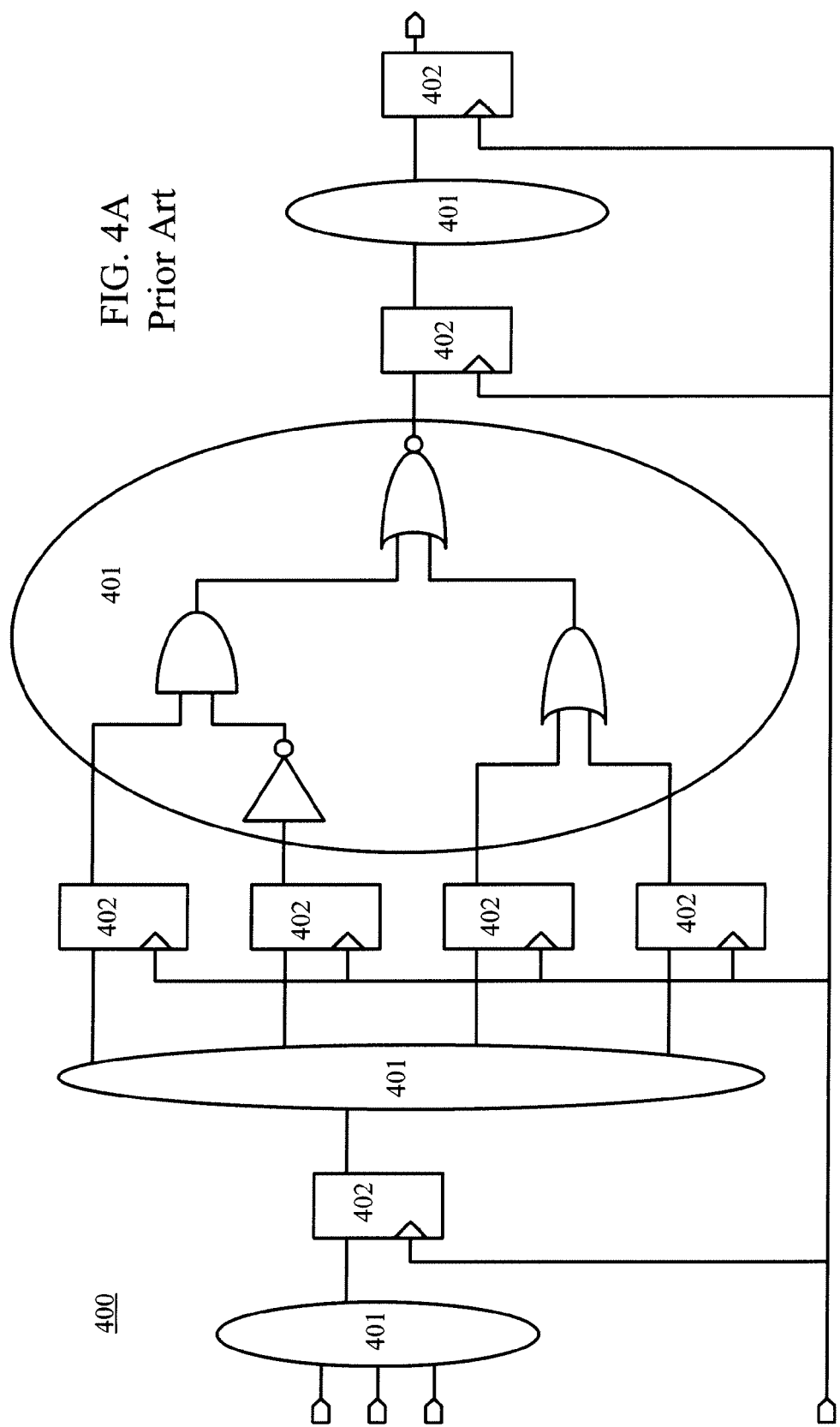
FIG. 4A illustrates an exemplary block that can include various interconnected combinational logic and sequential elements.
Figure 4B:
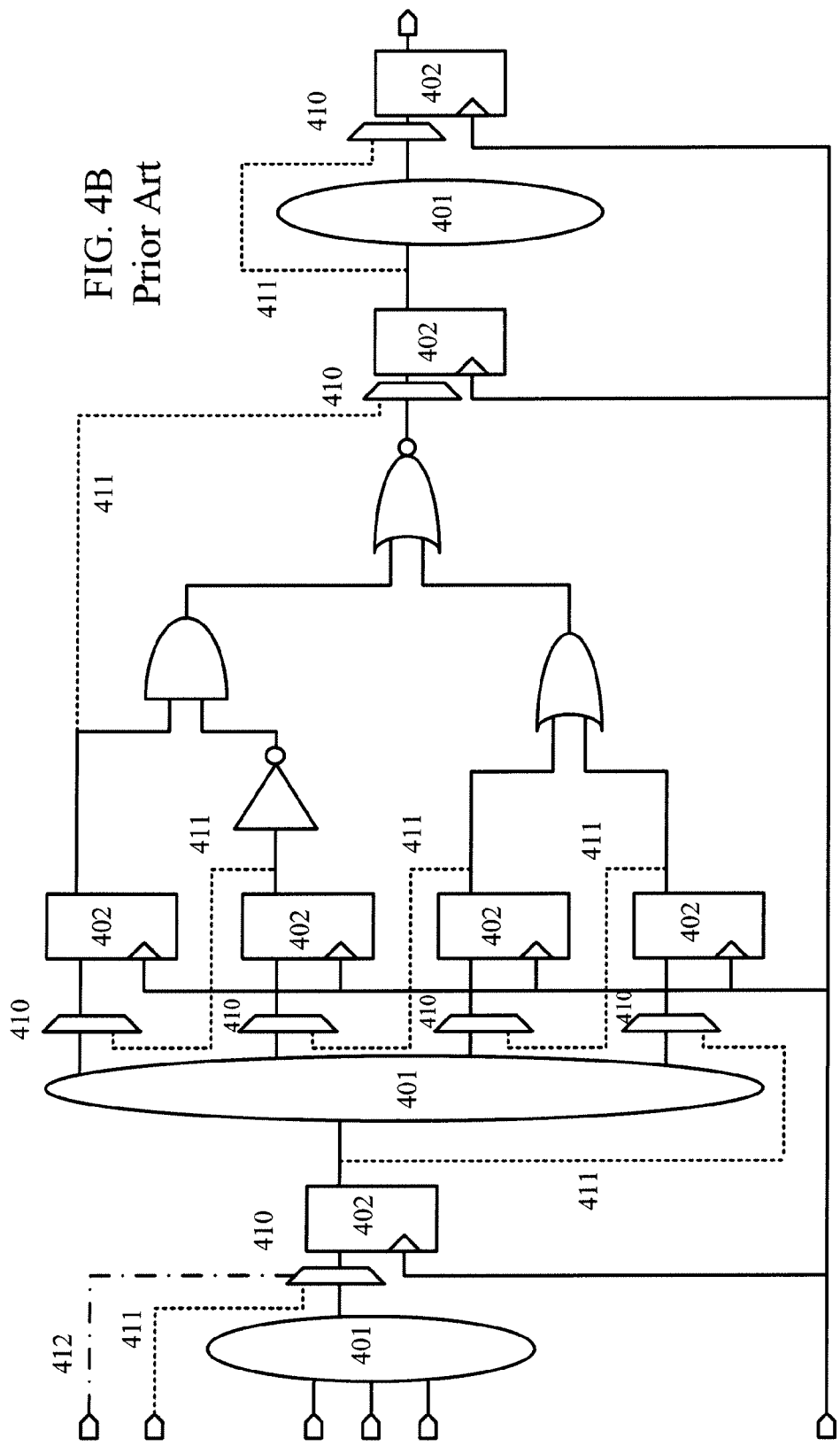
FIG. 4B illustrates the block of FIG. 4A as modified to include scan cells.
Figure 5:
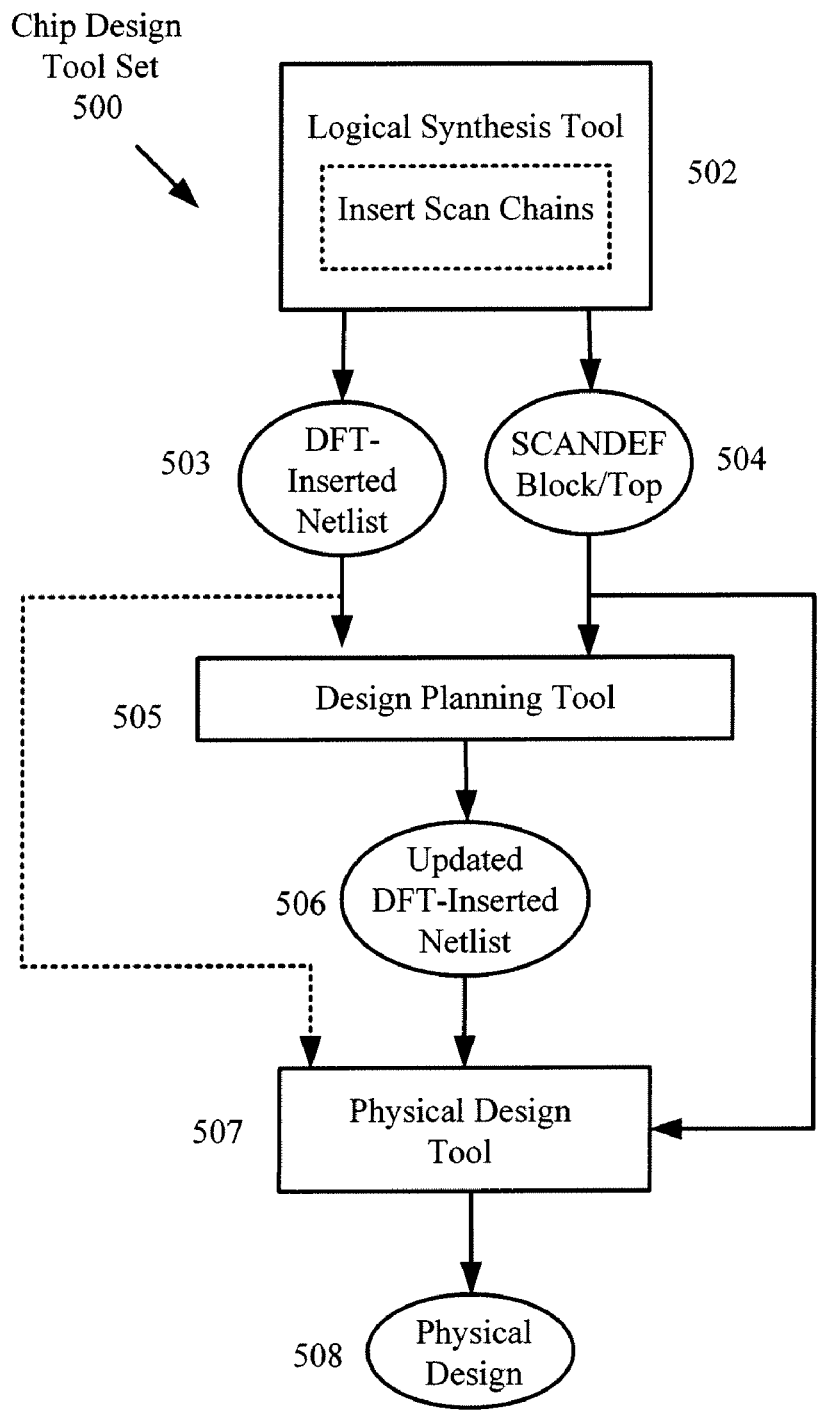
FIG. 5 illustrates a conventional design planning tool set including a logical synthesis tool and an Physical design tool.
Figure 8:
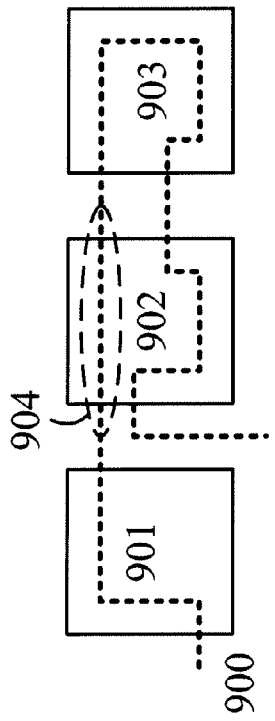
FIGS. 8, 9, and 10 illustrates various types of problems that can be minimized by a DFT-aware design planning technique.

FIG. 8 illustrates one type of problem that can be minimized by a DFT-aware design planning technique. Specifically, as shown in FIG. 8, a scan chain 800 (represented by a dotted wire) traverses various blocks A, B, C, and D (in hierarchical order), which in a physical hierarchy results in three top-level wires between a plan group 801 (including blocks A and C) and a plan group 802 (including blocks B and D). A DFT-aware design planning technique can advantageously minimize the number and length of top-level wires between plan groups (see, e.g. FIG. 13). Note that long top-order wires may require additional drivers to preserve signal strength, wherein such drivers need additional power feeds. Thus, minimizing the number and length of top-level wires can significantly simplify top-level design. In one embodiment, only one top-order wire per scan chain is preferably placed between plan groups.

Figure 9:
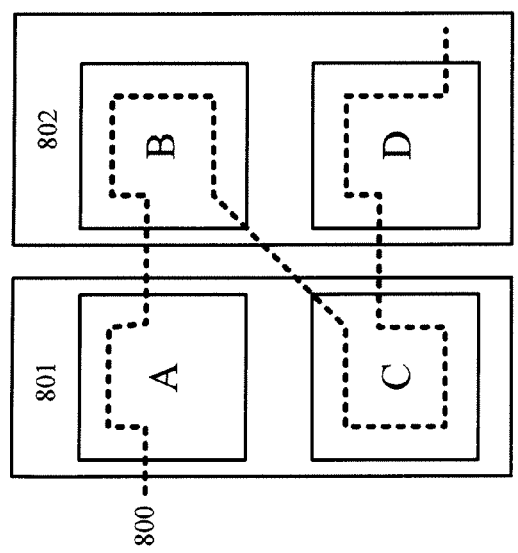

FIG. 9 illustrates another type of problem that can be minimized by a DFT-aware design planning technique. Specifically, as shown in FIG. 9, a scan chain 900 traverses plan groups 901, 903, and 902 (in hierarchical order); however, plan group 902 is physically positioned between plan groups 901 and 903. Therefore, a feedthrough 904 is needed to implement scan chain 900. Unfortunately, plan groups are typically designed asynchronously (as mentioned previously, each plan group/block may be designed by a different engineer). Thus, including a feedthrough currently requires a re-design of the logical hierarchy of that plan group, thereby adding engineering time as well as congestion. The DFT-aware design planning technique can minimize the number of feedthroughs by automatic reordering of the plan groups (see, e.g. FIG. 14).

Figure 10:
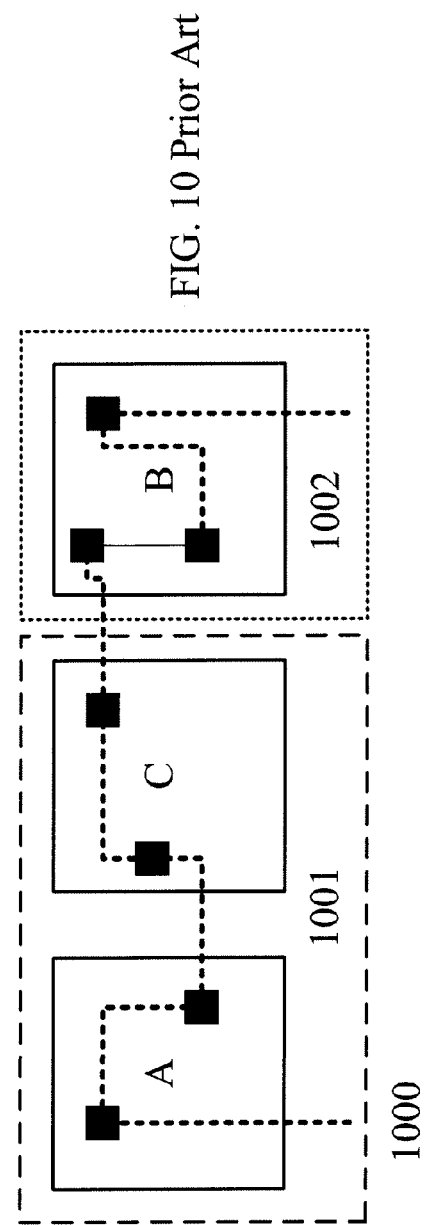

FIG. 10 illustrates yet another type of problem that can be solved by the DFT-aware design planning technique. Specifically, assume that blocks A, C, and B originally formed one plan group, wherein a scan chain 1000 traverses blocks A, C, and B (in hierarchical order). However, due to physical considerations, the former single plan group is divided into plan groups 1001 (dashed-line box) and 1002 (dotted-line box). As discussed above, conventional scan data cannot be automatically updated to reflect this dividing (or merging in other embodiments) of plan groups with respect to scan chain 1000. In contrast, the disclosed DFT technique can facilitate automatic updating of scan data (at both the block-level and top-level).

In accordance with one feature of the DFT-aware design planning technique, full-chip scan data can be used. For example, FIG. 11A illustrates a simple top-level hierarchy including blocks A, C, and B. FIG. 11B illustrates scan cells within those blocks. Specifically, block A includes scan cells S and T; block C includes scan cells U and V; and block B includes scan cells W, Z, and X. Note that a scan chain 1101 has scan cells in this order: S, T, U, V, Y, W, Z, and X. FIG. 11C illustrates exemplary full-chip scan data 1102 for blocks A, C, and B and top-level scan cell Y.

Note that in scan data 1102, each scan cell in a block includes designations for that block. For example, "A/S" designates block A and scan cell S and "B/W" designates block B and scan cell W. In one embodiment, data 1102 can list the scan cells in the design in the order provided in their corresponding scan chain. Moreover, full-chip scan data 1102 can include a listing of all scan chains (only one shown in FIG. 11C, SCANCHAINS 1) and constraints (e.g. FLOATING, PARTITION, ORDERED). Note that in this embodiment, scan chain 1101 starts and ends at the boundaries of the chip and therefore has pads designated (i.e. pad1/out and pad2/in).

Figure 12:
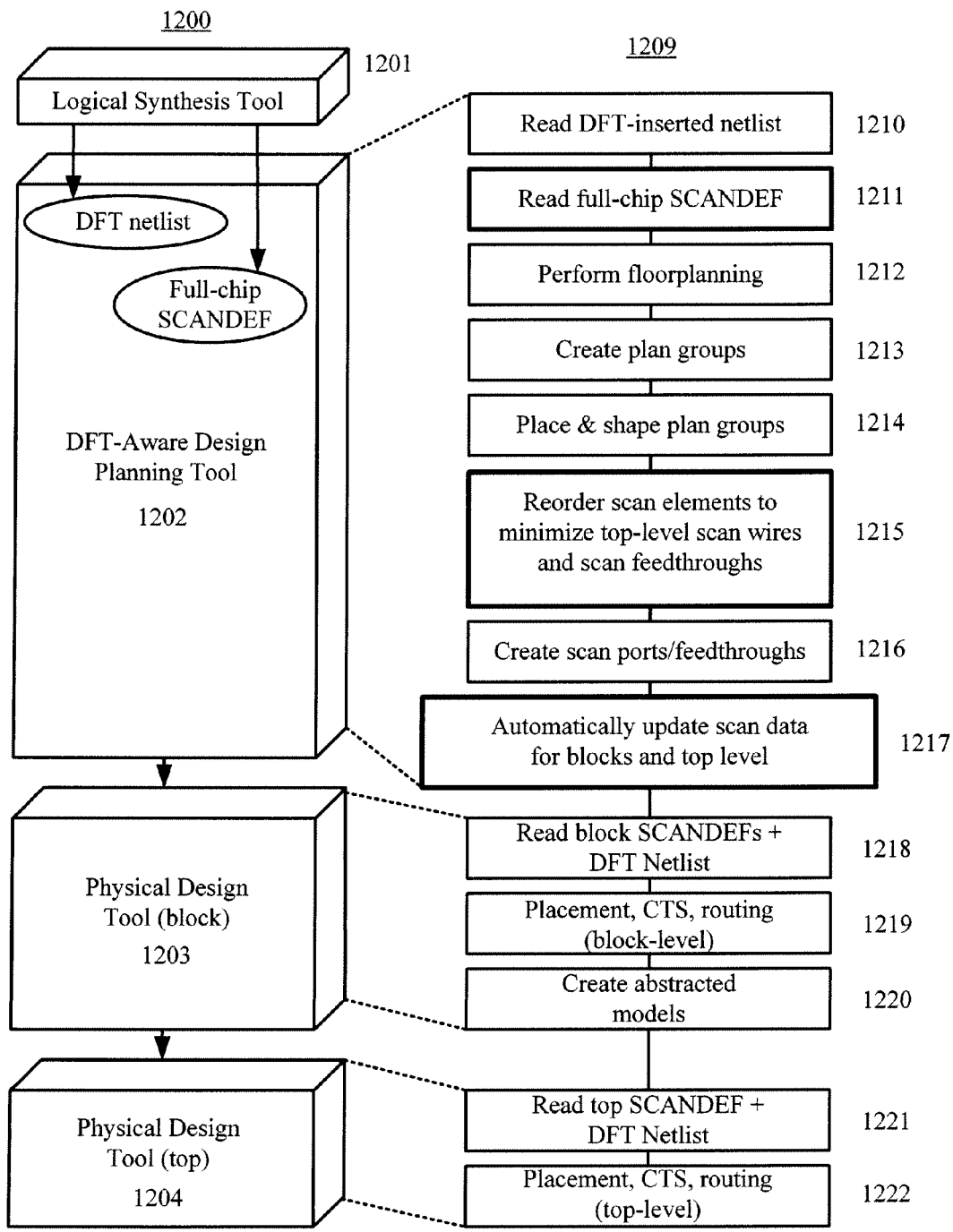
FIG. 12 illustrates an exemplary optimized chip design tool set that can generate and use full-chip scan data as well as the steps of a DFT-aware design planning technique that can be performed by certain tools of the chip design tool set.

FIG. 12 illustrates an exemplary optimized chip design tool set 1200 that can generate and use this full-chip scan data as well as the steps of a DFT-aware design planning technique 1209 that can be performed by certain tools of chip design tool set 1200. In this embodiment, optimized chip design tool set 1200 can include a logical synthesis tool 1201, a DFT-aware design planning tool 1202, a block-level physical design tool 1203, and a top-level physical design tool 1204.

In this embodiment, logical synthesis tool 1201 can generate a standard DFT-inserted netlist and a full-chip SCANDEF (wherein this full-chip SCANDEF describes all scan cells on the chip that can be reordered and any constraints on such reordering). DFT-aware design planning tool 1202 can read the DFT-inserted netlist in step 1210 and the full-chip SCANDEF in step 1211 to perform initial floorplanning in step 1212. This floorplanning typically includes assigning certain functionalities performed by the IC to different gross regions of the chip. Floorplanning can also assign macros in a similar manner.

Plan groups can be created in step 1213. Notably, each plan group can include one block, multiple blocks, or a portion of a block. In step 1214, the plan groups can be assigned to non-overlapping locations on the chip (in particular, the 2D representation of the chip). These non-overlapping locations define the physical hierarchy. In one embodiment, the creation, placement, and shaping of the plan groups can be automatically performed by DFT-aware design planning tool 1202, with a user override.

In accordance with one feature of a DFT-aware design planning technique, DFT-aware design planning tool 1202 can advantageously reorder the scan elements (e.g. scan cells, buffers, etc.) in a scan chain to minimize top-level scan wires and scan feedthroughs in step 1215. Step 1216 can create scan ports and feedthroughs based on step 1215. Finally, by using the full-chip SCANDEF and the results of step 1215, DFT-aware design planning tool 1202 can automatically update SCANDEF data at the block-level and top-level in step 1217.

A block-level physical design tool 1203 can read the block-level SCANDEF and the DFT-inserted netlist in step 1218 to perform placement of the cells, clock-tree synthesis (CTS), and routing between the cells in step 1219 and then create abstracted models of the block to be used at the top-level implementation in step 1220. A top-level physical design tool 1204 can read the top-level SCANDEF and the DFT-inserted netlist in step 1221 to perform placement of the blocks and top-level cells, CTS and routing in step 1222. At this point, a physical design for the IC is complete and can be output.

Notably, the use of a full-chip SCANDEF in step 1211 enables the minimizing of top-level scan wires and scan feedthroughs (step 1215). An excessive number of top-level wires and feedthroughs can cause unacceptable routing congestion. Thus, using the full-chip SCANDEF in DFT-aware design planning can provide dramatic improvements in physical placement and chip manufacturability.

Note that steps 1211, 1215, and 1217, which can be characterized as creating the DFT-aware design planning process, are described in further detail herein. The remaining steps can be implemented using standard processes and therefore are not explained in further detail herein.

Figure 13:
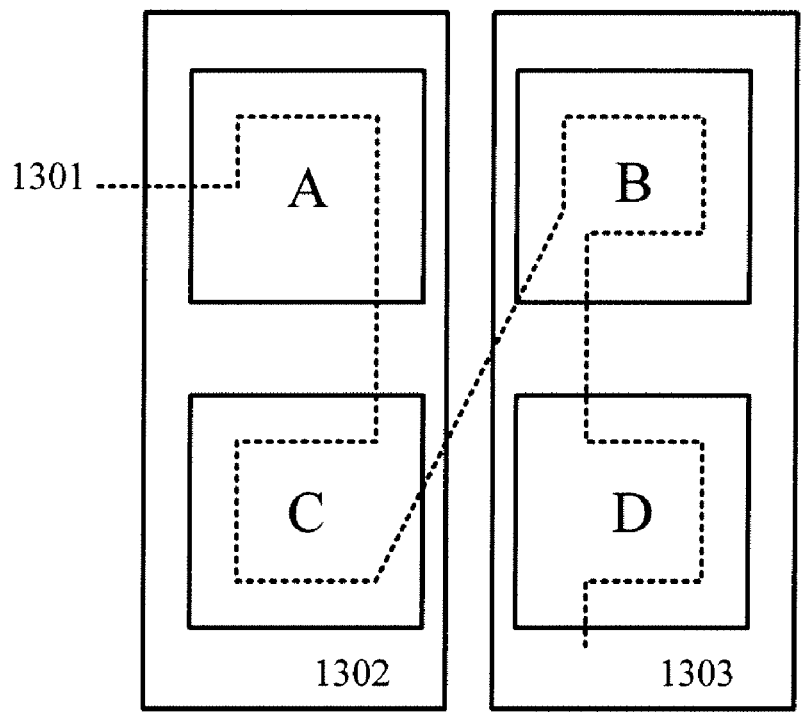
FIGS. 13 and 14 illustrate solutions provided by a DFT-aware design planning technique.

FIG. 13 illustrates one solution provided by the DFT-aware design planning technique. Specifically, a first plan group 1302 includes two blocks A and C and a second plan group 1303 includes blocks B and D. Assume that a scan chain 1301 is created that initially traverses blocks A, B, C, and D in a logical hierarchy. To minimize the number of top-level scan wires between plan groups 1302 and 1303 during DFT-aware design planning, the scan cells can be reordered such that scan chain 1301 traverses blocks A, C, B, and D. Referring back to FIG. 8, note that scan chain 800 could include the same scan cells shown in FIG. 13. However scan chain 800 needs three top-level wires between plan groups 801 and 802 because the logical and physical hierarchy must be the same. In contrast, in FIG. 13, there is only one top-level wire between plan groups 1302 and 1303. As explained in further detail below, the scan cell reordering in DFT-aware design planning can be accomplished by promoting scan cell connections within plan groups. Notably, this reordering can be performed solely in the physical hierarchy, thereby providing significant resource efficiencies.

Figure 14:
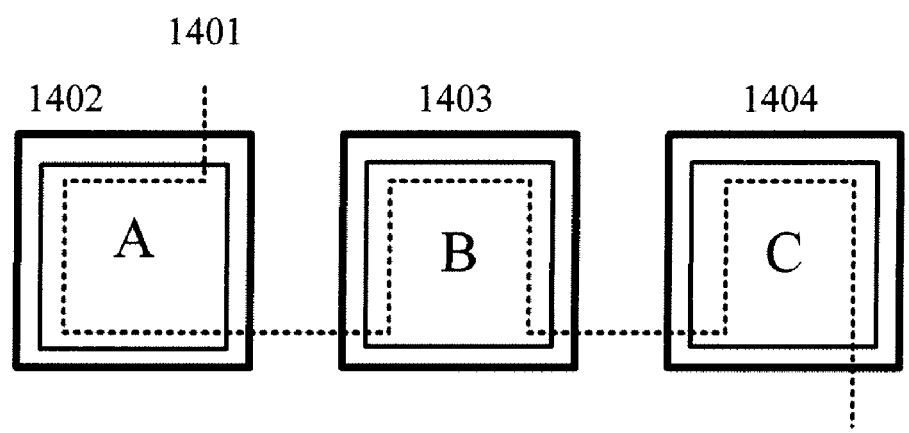

FIG. 14 illustrates another solution provided by a DFT-aware design planning technique. In FIG. 14, each plan group includes one block, i.e. plan group 1402 includes block A, plan group 1403 includes block B, and plan group 1404 includes block C. Assume that a scan chain 1401 is created that initially traverses blocks A, C, and B in a logical hierarchy. To minimize the number of scan feedthroughs between plan groups 1402, 1403, and 1404 during design planning, the scan cells can be reordered such that scan chain 1401 traverses plan groups 1402, 1403, and 1404. Referring back to FIG. 9, note that scan chain 900 could include the same scan cells shown in FIG. 14. However scan chain 900 needs a scan feedthrough in plan group 902. In contrast, in FIG. 14, no scan feedthroughs are needed. As explained in further detail below, this feedthrough minimization can be accomplished by in effect reordering the plan groups along the scan chain.

Figure 15:
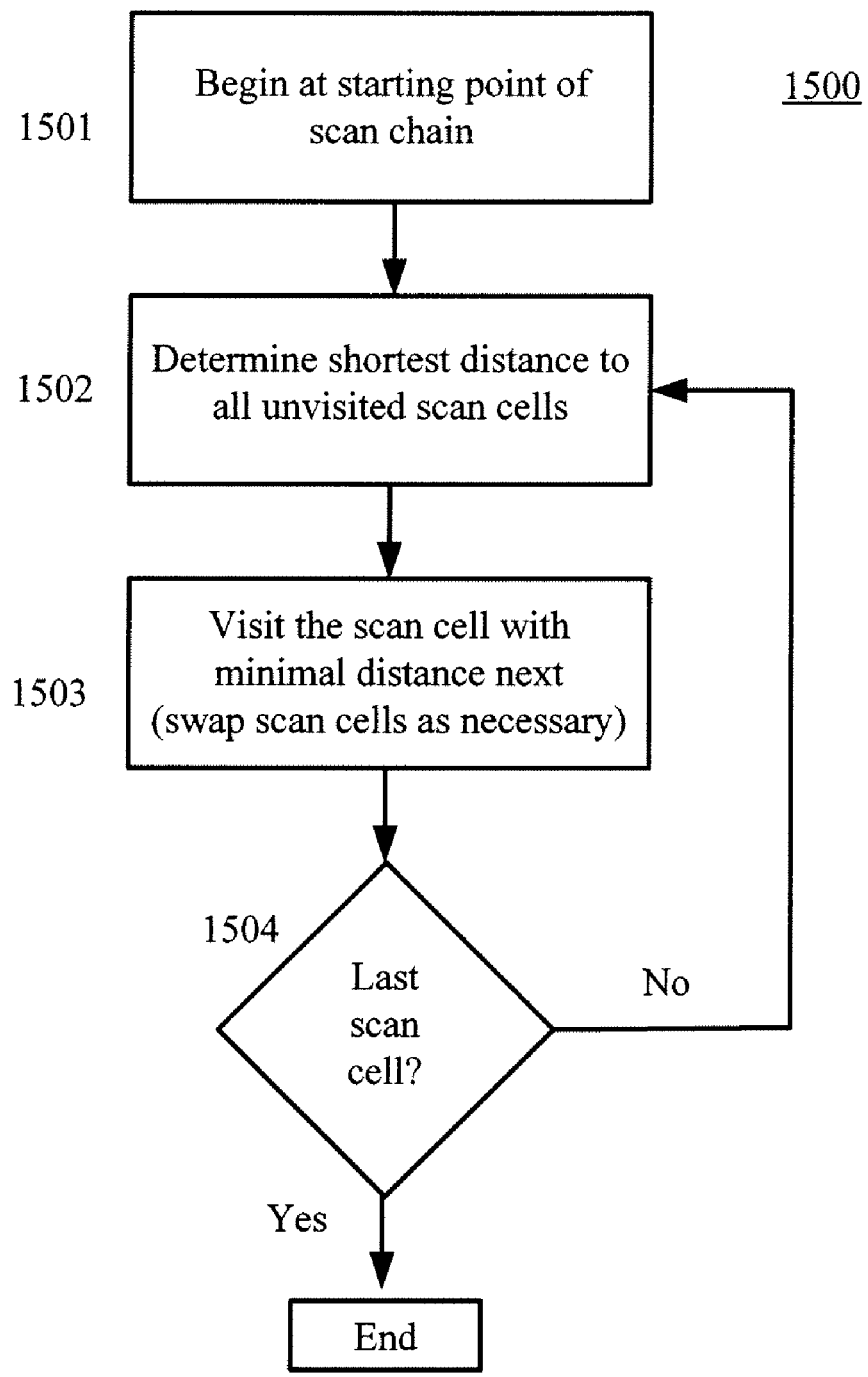
FIG. 15 illustrates a conventional scan cell reordering technique.

FIG. 15 illustrates a conventional scan cell reordering technique 1500. In step 1501, a beginning of a scan chain is identified. In step 1502, the shortest distance from a first scan cell of the scan chain to all other scan cells of the scan chain is determined. In step 1503, the scan cell associated with the shortest distance is then visited. After visiting each scan cell, the order of the scan cells in the scan chain can be recorded. Step 1504 determines whether that visited scan cell is the last scan cell in the scan chain. If not, then technique 1500 loops back to step 1502. If that scan cell is the last scan cell in the scan chain, then technique 1500 appends a STOP point to the ordered/reordered scan chain (wherein the STOP point can be either at block-level or at top-level). Scan cell reordering for each scan chain for each block (and at the top-level) can proceed using the same steps shown in technique 1500.

Figure 16:
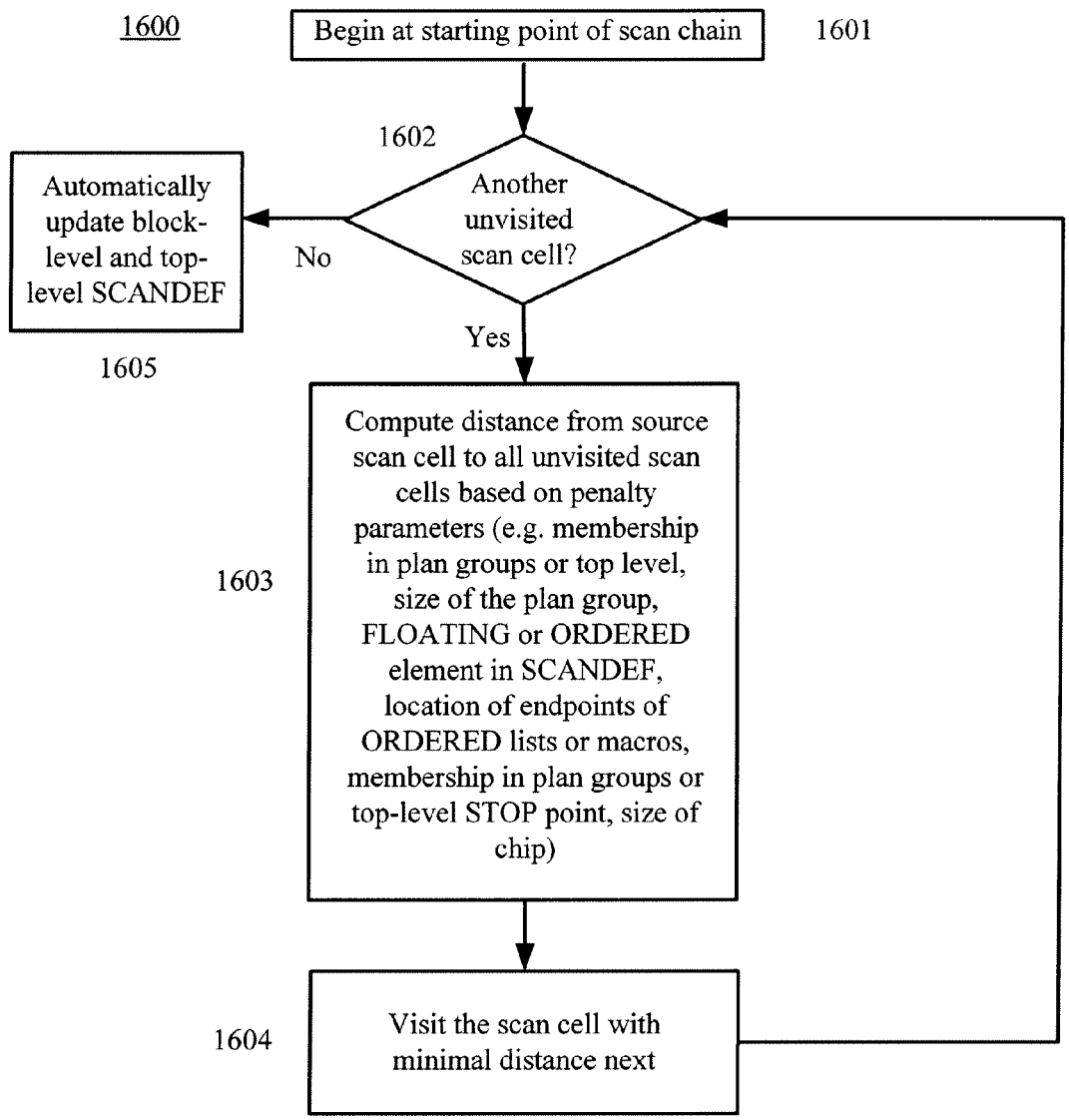
FIG. 16 illustrates an exemplary scan cell reordering technique that can be used in the DFT-aware design planning technique.

FIG. 16 illustrates an exemplary scan cell reordering technique 1600 that can be used in step 1215 (FIG. 12). Note that in addition to minimizing top-level scan wires and scan feedthroughs, which can be characterized as primary objectives, secondary objectives can also be achieved when using technique 1600. Exemplary secondary objectives can include minimizing the overall scan wire length, optimizing the order of plan groups along the scan chain, and/or minimizing the fragmentation of scan cell clusters at the same physical hierarchy level.

Step 1601 begins the technique by identifying a scan cell at the beginning of one scan chain. Notably, except as required by ORDERED elements in the SCANDEF, the scan cells within that scan chain can be reordered. Step 1602 determines whether there is another unvisited scan cell in the scan chain. If so, then step 1603 computes the distance to all unvisited scan cells based on predetermined penalty parameters. Step 1604 then visits the scan cell with the minimal distance next. At this point, technique 1600 returns to step 1602. After all scan cells in a scan chain have been visited, then step 1605 can automatically update both block-level and top-level scan chain files.

In reference to step 1603, exemplary penalty parameters can include, for example, membership in plan groups or top level, the size of a plan group, whether the scan chain elements are FLOATING or ORDERED as specified in the scan data, the location of endpoints of macros (that include embedded scan chains) or ORDERED lists, membership in plan groups having the STOP point, and/or the size of the chip. These penalty parameters will now be explained in further detail. Note that when no penalty parameter is present, then the penalty is zero.

Figure 17A:
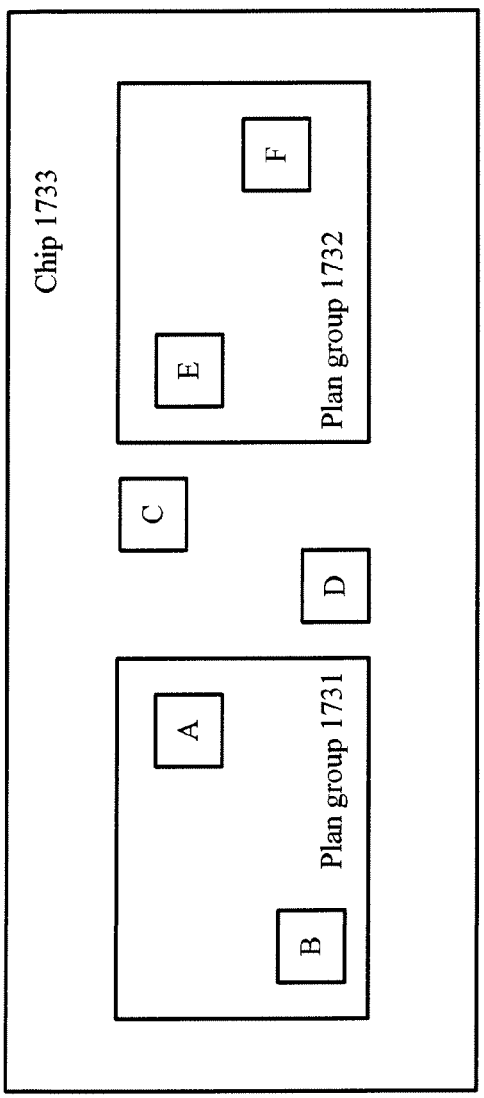
FIGS. 17A, 17B, 17C, 17D, and 17E illustrate how various penalty parameters can affect computing the distance to an unvisited scan cell.

For example, referring to FIG. 17A, because a source scan cell A and a potential destination scan cell B are in the same plan group 1731, then the computed distance is the actual distance between scan cells A and B. Similarly, because the source scan cell C and a potential destination scan cell D are both at the top-level, then the computed distance is the actual distance between scan cells C and D. In contrast, because source scan cell A and a potential destination scan cell E are in different plan groups, i.e. plan groups 1731 and 1732, respectively, then the computed distance is the actual distance between scan cells A and E plus a penalty. Similarly, because source scan cell A and a potential destination scan cell C are not in the same plan group, i.e. plan group 1731 and top-level, respectively, then the computed distance is the actual distance between scan cells A and C plus a penalty. In one embodiment, the penalty can be equal to a fraction of the perimeter of plangroup 1731. In this manner, the penalty can promote scan cell reordering within a plan group or the top-level.

As noted above, the size of a plan group can be considered as a penalty parameter. That is, consider that once a scan chain enters a plan group, the exit point (i.e. the scan-out port) may be far away and the wire to return to connect elements close to an entrance point may be undesirably long. Thus, referring to FIG. 17A and assuming that plan group 1732 is not present, if scan cell A is the source scan cell and if plan group 1731 is larger than a predetermined threshold, then it may be better to sequentially order scan cells A, C, D, B rather than A, B, D, C (for example). In one embodiment, the distance between scan cells A and C can be computed with a first penalty (based on A and C not being in the same plan group) and the distance between scan cells A and B can be computed with a second penalty (assuming that plan group 1731 is larger than the predetermined size, the entrance and exit points are on opposite sides of the plan group, and the remaining unvisited cells are closer to the entrance point than to the exit point). In one embodiment, the first penalty can be smaller than the second penalty, such that the scan cells are ordered A, C, D, B. Note that when the scan cells are in the same plan group, then the penalty is zero.

Figure 17B:
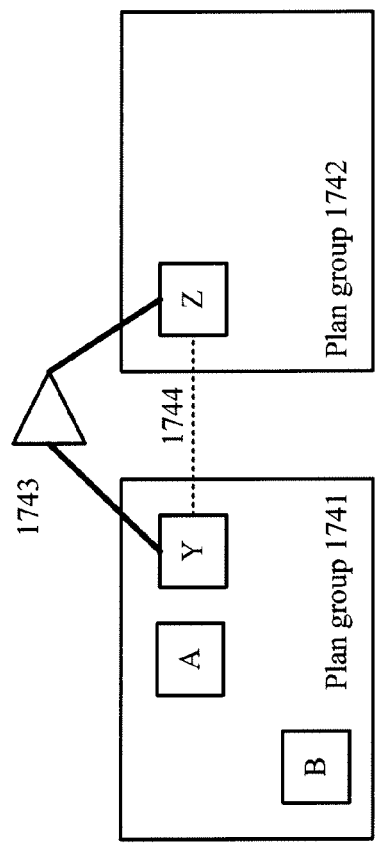

Note that in addition to the constraints mentioned above (e.g. clocks, voltage, etc.), another type of constraint can mandate an order of certain scan cells. Specifically, FLOATING elements can be reordered, whereas ORDERED elements cannot be reordered. In one embodiment, only the "head" and "tail" of an ORDERED set are considered for penalty assessment and the "intermediate" scan elements in an ORDERED scan chain are removed from the scan chain list. For example, referring to FIG. 17B, an ORDERED list includes scan cell Y, buffer 1743, and scan cell Z (all characterized as "scan elements"). However, scan cells Y and Z are in plan groups 1741 and 1742, respectively. Therefore, when computing the distance between scan cells A and Y, a penalty can be added because scan cell Z (the tail scan element) is in a different plan group than scan cell A (i.e. even though scan cell Y is in the same plan group 1741 as scan cell A). In one embodiment, this penalty can be ½ the actual distance between scan cells Y and Z (which is indicated by the dotted line 1744) in addition to ½ the perimeter of plan group 1741. Therefore, with such a penalty, the scan cell order may be A, B, Y, buffer 1743, Z.

Figure 17C:
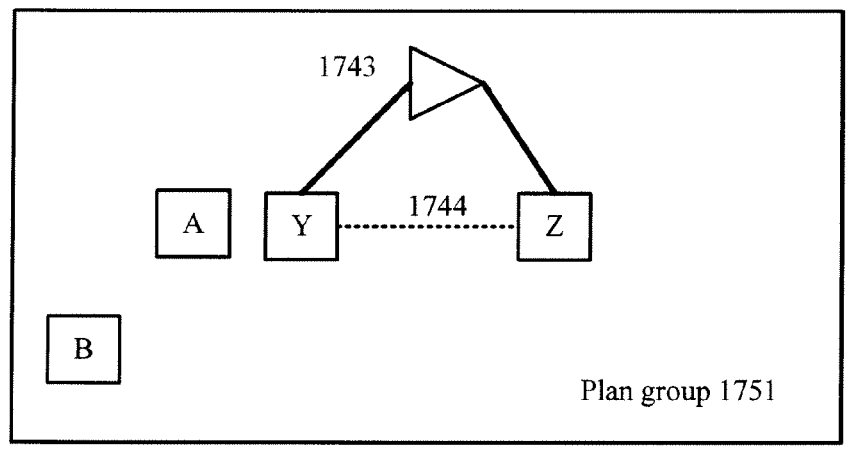

In one embodiment, even when the ORDERED list endpoints are at the same physical hierarchy (see, e.g. FIG. 17C in which scan cells A, B, Y, Z and buffer 1743 are in the same plan group 1751), the distance from scan cells Y (the head scan element) and Z (the tail scan element) can still be considered. For example, in one embodiment, the penalty can be ½ the actual distance 1744 between scan cells Y and Z. Therefore, similar to the case shown in FIG. 17B, the element order even within plan group 1751 may be A, B, Y, buffer 1743, Z.

Figure 17D:
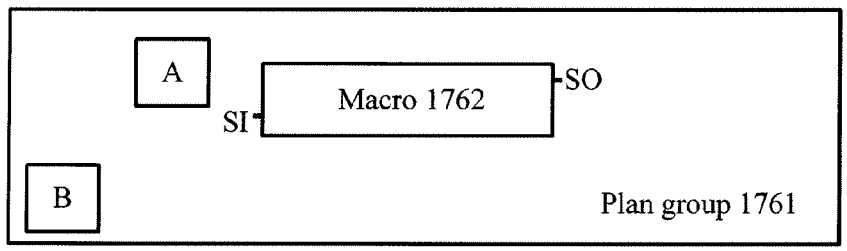

In a similar manner, the location of an endpoint of a macro including an embedded scan chain can also be considered as a penalty parameter. For example, referring to FIG. 17D, scan cells A and B and macro 1762 (which includes an embedded scan chain) are located in plan group 1761. Assuming that scan cell A is a source scan cell, the distance from scan cell A to the scan input (SI) of macro 1762 can include a penalty because the scan output (SO) of macro 1762 is located at a distance greater than a predetermined distance from the scan input (and thus returning from the scan output to scan cell B will result in a longer wire compared to first connecting A and B, and then macro 1762). In one embodiment, the penalty can be ½ the actual distance from the scan input to the scan output of macro 1762. Therefore, the element order in plan group 1761 may be A, B, macro 1762. In one embodiment, when the macro is not in the same plan group as the source scan cell, the penalty for scan cells in different plan groups (i.e. a fraction of the perimeter of the plan group) can be used in addition to the perimeter of the macro.

Figure 17E:
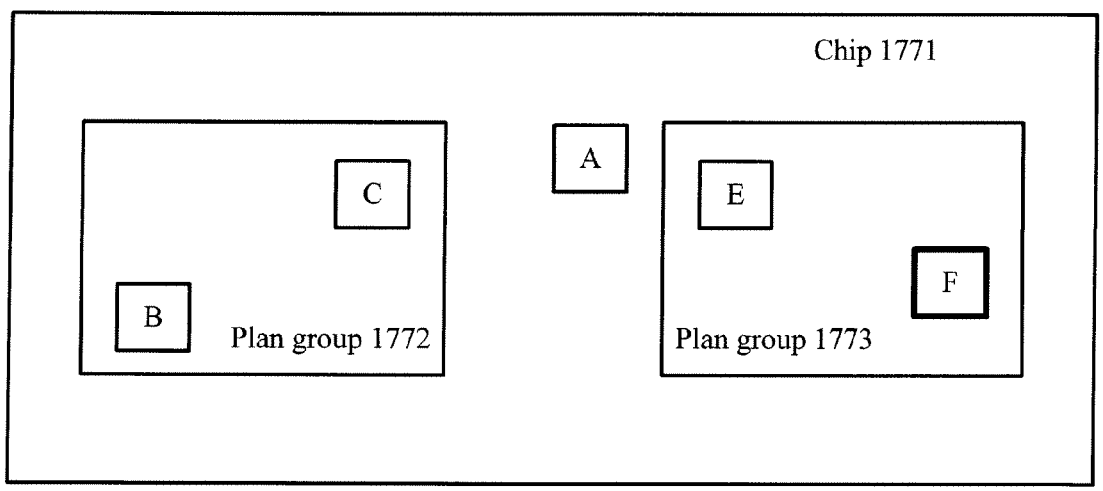

The membership in a plan groups containing the STOP endpoint can also be considered a penalty parameter. For example, referring to FIG. 17E, if a plan group 1773 includes a STOP point at scan cell F, i.e. the designated last scan cell of the scan chain, then any distance to a scan cell within that plan group (e.g. scan cell E) can include a penalty. In one embodiment, the penalty can be a fraction of the perimeter of chip 1771. In this manner, all scan cells except those in plan group 1773 (i.e. top-level and those in plan group 1772) are typically connected first. That is, assuming that scan cell A is the source scan cell, then the scan cell order may be A, C, B, E, F.

Referring back to FIG. 17A, steps 1702-1704 typically result in all scan cells within a plan group being visited before scan cells outside that plan group are visited. In this manner, reordering technique 1700 advantageously minimizes both top-level scan wires and scan feedthroughs (step 1215, FIG. 12B). As a result, after reordering technique 1700, each plan group typically has one entry/exit point for each scan chain. Then, technique returns to step 1702.

Once all scan cells in the scan chain have been visited, updated block-level SCANDEF and updated top-level SCANDEF data can be generated and output in step 1705. In one embodiment, this generating and outputting can be performed after each scan chain is visited. Steps 1701-1705 can be repeated for each scan chain in the design.

FIG. 18A illustrates exemplary plan groups that can be formed (step 1213) and how those plan groups can be reflected in the automatically updated SCANDEF (step 1218). Note that the full-chip SCANDEF for blocks A, C, and B as well as for top-level scan cell Y is shown in FIG. 11B. FIG. 18B illustrates block-level scan data 1801 for plan group P, which includes merged blocks A and C. FIG. 18C illustrates block-level scan data 1802 for plan group Q, which includes block B.

Note that scan chains that traverse a plan group boundary need to reflect that traversal in the scan data. That is, in effect, a scan chain that traverses a plan group boundary can be split up into two scan chains, each including "housekeeping" to ensure that such scan chains remain connected at the top-level. The scan chains must be split at the plan group boundary so that after the plan groups become individual blocks, physical implementation of each block can be completed independent of other blocks. To perform this splitting, the following housekeeping can be provided: maintaining the PARTITION label of the scan chains, maintaining any ORDERED constraints, and ensuring that each scan chain includes at least one sequential element (otherwise that scan chain would be a feedthrough).

Note further that updated block-level SCANDEF data 1801 and 1802 include plan group designators (i.e. P and Q, in this embodiment) as well as block designators (i.e. A, C, and B, in this embodiment). Note further that updated SCANDEF data 1801 and 1802 (like chip-level SCANDEF) can use scan cells as start and stop pins of the blocks. For example, plan group P has a start pin of scan cell S in block A and a stop pin of scan cell U in block C. The use of scan cells as start and stop pins advantageously eliminates the need to create pins at the boundaries of the blocks, thereby simplifying scan cell analysis.

FIG. 18D illustrates top-level scan data 1803 for plan groups P and Q as well as top-level scan cell Y. Note that in this top-level scan data, each plan group essentially becomes a macro that only indicates its number of BITS (i.e. number of scan cells in each embedded chain). Top-level scan cells, such as scan cell Y, can be designated as having one bit. Further note that should a feedthrough be needed (not shown in scan data 1803), which would only be described in the updated top-level scan data (not in block-level scan data), such a plan group could be described as having zero bits (e.g. M (IN TI1)(OUT SO1) (BITS 0)).

Figures 19A, 19B:
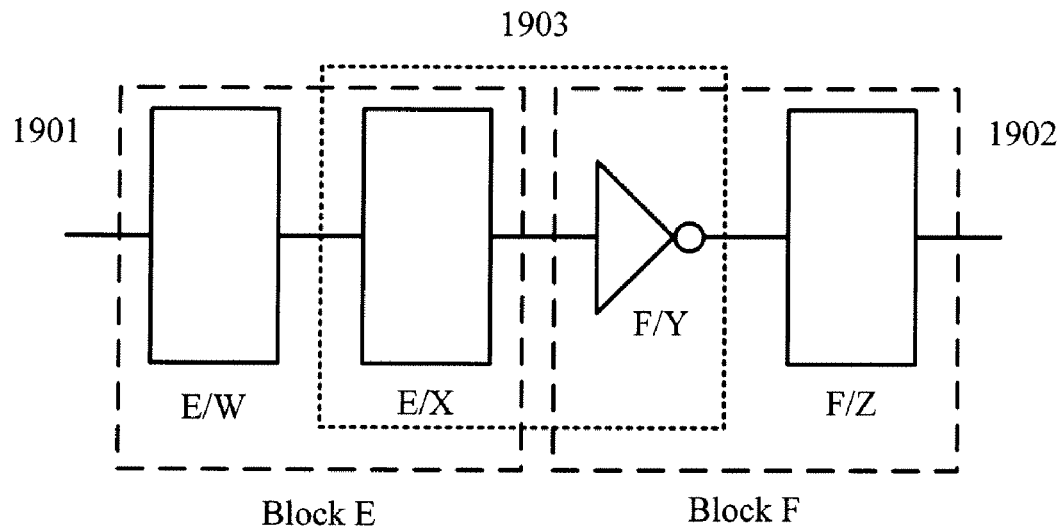
FIGS. 19A, 19B, 19C, 19D, and 19E illustrate how to split around an ORDERED list when generating block-level scan data.

Note that elements in an ORDERED list in SCANDEF cannot be split because the elements need to be kept together. For example, FIG. 19A illustrates scan cells W and X within a logical hierarchy E (see dashed box 1901) and scan cells Y and Z within a logical hierarchy F (see dashed box 1902). FIG. 19B illustrates full-chip scan data 1904 for the elements in FIG. 19A. As indicated in FIG. 19B, scan cells X and Y form an ORDERED list (see dotted box 1903).

Figures 19C, 19D, 19E:
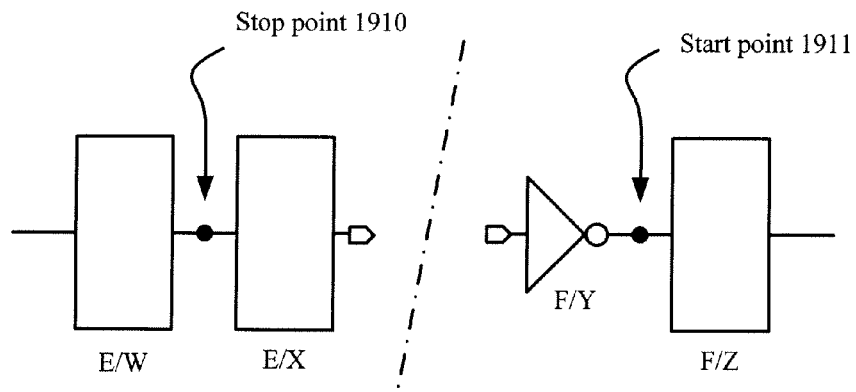

Notably, to create block-level SCANDEF, the scan chain can be split "around" the ORDERED list. FIG. 19C illustrates an exemplary splitting of the scan chain around the ORDERED list (which includes scan cell X and inverter Y). Note that a stop point 1910 is placed between scan cells W and X, whereas a start point 1911 is placed between inverter Y and scan cell Z. FIG. 19D illustrates block-level scan data 1912 for block E, whereas 19E illustrates block-level scan data 1913 for block F.

Figure 20:
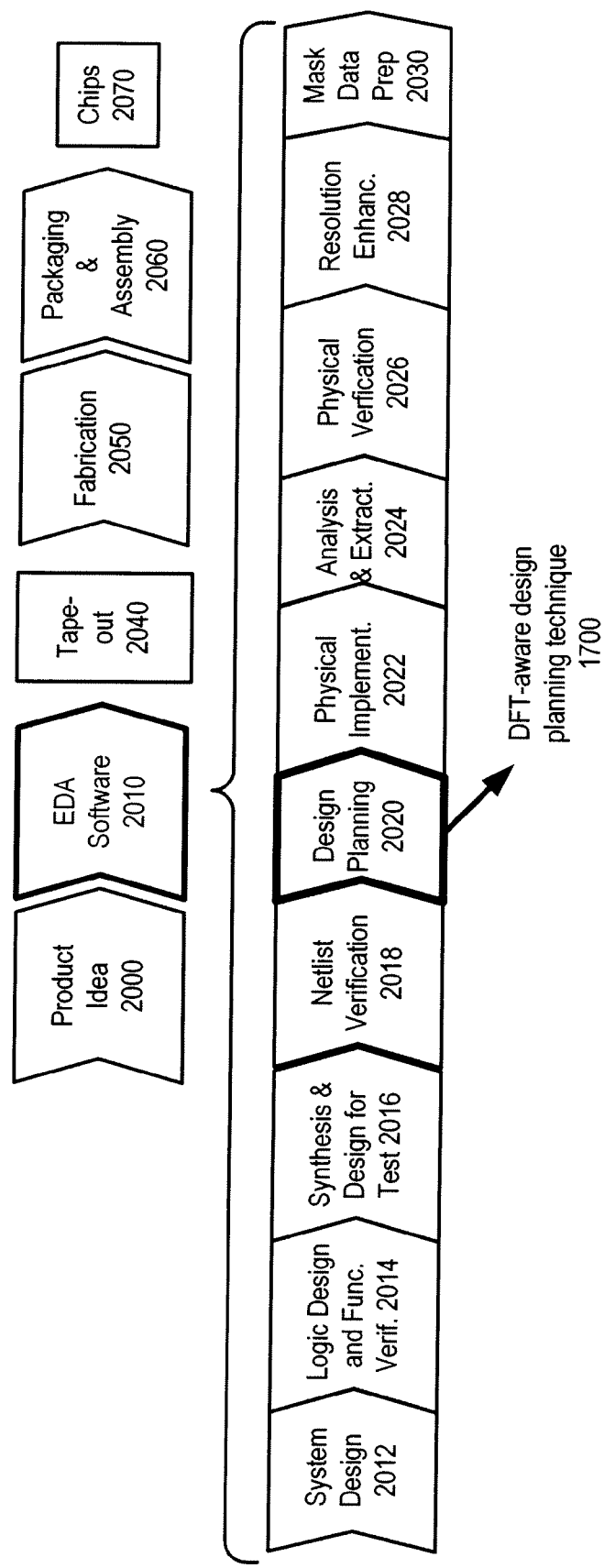
FIG. 20 illustrates a chip production flow including the DFT-aware design planning technique.

To place this DFT-aware process in context, FIG. 20 shows a simplified representation of an exemplary digital ASIC design flow. At a high level, the process starts with the product idea (step 2000) and is realized in an EDA software design process (step 2010). When the design is finalized, it can be taped-out (event 2040). After tape out, the fabrication process (step 2050) and packaging and assembly processes (step 2060) occur resulting, ultimately, in finished chips (result 2070).

The EDA software design process (step 2010) is actually composed of a number of steps 2012-2030, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 2010) will now be provided:

System design (step 2012): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 2014): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 2016): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 2018): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 2020): Here, an overall floorplan for the chip is constructed and analyzed for timing and top-level routing. The above-described DFT-aware design planning technique can be included in this design planning. Exemplary EDA software products from Synopsys, Inc. that can be used at this step include Astro and IC Compiler products.

Physical implementation (step 2022): The placement (positioning of circuit elements) and routing (connection of the same) occurs at this step. Exemplary EDA software products from Synopsys, Inc. that can be used at this step include the Astro and IC Compiler products.

Analysis and extraction (step 2024): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 2026): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 2028): This step involves geometric manipulations of the layout to improve manufacturability of the design. Exemplary EDA software products from Synopsys, Inc. that can be used at this step include Proteus, ProteusAF, and PSMGen products.

Mask data preparation (step 2030): This step provides the "tape-out" data for production of masks for lithographic use to produce finished chips. Exemplary EDA software products from Synopsys, Inc. that can be used at this step include the CATS(R) family of products.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent to practitioners skilled in this art.

For example, the DFT-aware planning design tool set can include a computer program product tangibly embodied in a machine-readable storage device for execution by a programmable processor. The above-described techniques can be performed by a programmable processor executing a program of instructions to perform the described functions by operating on input data and generating output data.

Each computer program can be implemented in a high-level procedural or object-oriented programming language, or in assembly or machine language if desired. In any case, the language can be a compiled or interpreted language. Suitable processors include, for example, both general and special purpose microprocessors, as well as other types of microcontrollers. Generally, a processor can receive instructions and data from a read-only memory (ROM) and/or a random access memory (RAM). Generally, a computer can include one or more mass storage devices for storing data files. Exemplary mass storage devices include magnetic disks (such as internal hard disks and removable disks), magneto-optical disks, and optical disks. Storage devices suitable for tangibly embodying computer program instructions and data include all forms of non-volatile memory, including by way of example semiconductor memory devices (such as EPROM, EEPROM, and flash memory devices), magnetic disks (such as internal hard disks and removable disks), magneto-optical disks, and CDROM disks. Any of the foregoing can be supplemented by, or incorporated in, application-specific integrated circuits (ASICs).

Accordingly, it is intended that the scope of the invention be defined by the following claims and their equivalents.

The invention claimed is:

1. A method of performing design-for-test (DFT) aware design planning, the method comprising:
reading a DFT-inserted netlist for an integrated circuit (IC);
reading full-chip scan data for scan chains of the IC;
performing floorplanning on the IC using the DFT-inserted netlist;
creating, placing, and shaping plan groups based on results of the floorplanning;
using a computer, minimizing top-level scan wires and scan feedthroughs between the plan groups using the full-chip scan data;
generating block-level scan data and top-level scan data after the minimizing;
performing placement, clock-tree synthesis (CTS), and routing using the block-level scan data and the top-level scan data and the DFT-inserted netlist; and
outputting a physical design.

2. The method of claim 1, wherein the minimizing top-level scan wires and scan feedthroughs includes, for each scan chain:
beginning at a starting point of a scan chain;
determining whether another unvisited scan cell in the scan chain exists;
computing a distance from a source scan cell to all unvisited scan cells in the scan chain based on one or more penalty parameters;
visiting an unvisited scan cell with a minimal distance; and
repeating the determining, computing, and visiting a plurality of times.

3. The method of claim 2, wherein the determining, computing, and visiting are repeated until all scan cells in the scan chain are visited.

4. The method of claim 3, wherein the minimizing top-level scan wires and scan feedthroughs further includes:
automatically updating block-level and top-level scan data to reflect optimized scan chains.

5. The method of claim 2, wherein the one or more penalty parameters include at least one of: membership in a plan group or a top-level physical hierarchy, size of a plan group, FLOATING/ORDERED scan element in scan data, location of endpoints of an ORDERED list, location of endpoints of a macro, and membership in a plan group including a STOP point.

6. The method of claim 5, wherein when the source scan cell is in a first plan group and an unvisited scan cell is in the first plan group, then the distance is an actual distance between the source scan cell and the unvisited scan cell.

7. The method of claim 5, wherein when the source scan cell is in a first plan group and an unvisited scan cell is not in the first plan group, then the distance is an actual distance between the source scan cell and the unvisited scan cell plus a penalty, wherein the penalty is a fraction of a perimeter of the first plan group.

8. The method of claim 5, wherein when the source scan cell and an unvisited scan cell are in the top-level physical hierarchy, then the distance is an actual distance between the source scan cell and the unvisited scan cell.

9. The method of claim 5, wherein when the source scan cell is in a first plan group and an unvisited scan cell is a first scan cell of an ORDERED list of scan cells located in the first plan group, then the distance is an actual distance between the source scan cell and the unvisited scan cell plus a penalty, wherein the penalty is a fraction of a second distance between the first scan cell and a last scan cell of the ORDERED list.

10. The method of claim 5, wherein when the source scan cell is in a first plan group and an unvisited scan cell forms a first scan cell of an ORDERED list, then the distance is an actual distance between the source scan cell and the unvisited scan cell plus a penalty when the first scan cell and/or a last scan cell in the ORDERED list are not in the first plan group.

11. The method of claim 5, wherein when the source scan cell is in a first plan group and an unvisited scan cell is in a macro including an embedded scan chain, the macro being located in the first plan group, then the distance is an actual distance between the source scan cell and a scan input of the macro plus a penalty, wherein the penalty is a fraction of a second distance between the scan input and a scan output of the macro.

12. The method of claim 5, wherein when the source scan cell is in a first plan group and an unvisited scan cell is in a macro including an embedded scan chain, the macro being located in a second plan group, then the distance is an actual distance between the source scan cell and a scan input of the macro plus a penalty, wherein the penalty is a fraction of a perimeter of the first plan group.

13. A non-transitory computer-readable medium storing computer-executable instructions for performing design-for-test (DFT) aware design planning, wherein said instructions, when executed by a computer, perform steps comprising:
    reading a DFT-inserted netlist for an integrated circuit (IC);
    reading full-chip scan data for scan chains of the IC;
    performing floorplanning on the IC using the DFT-inserted netlist;
    creating, placing, and shaping plan groups based on results of the floorplanning;
    minimizing top-level scan wires and scan feedthroughs between the plan groups using the full-chip scan data;
    generating block-level scan data and top-level scan data after the minimizing;
    performing clock-tree synthesis (CTS) and routing based on the block-level scan data and the DFT-inserted netlist; and
    outputting a physical design based on the top-level scan data, the block-level scan data, the CTS, and the routing.

14. The non-transitory computer-readable medium of claim 13, wherein the minimizing top-level scan wires and scan feedthroughs includes, for each scan chain:
    beginning at a starting point of a scan chain;
    determining whether another unvisited scan cell in the scan chain exists;
    computing a distance from a source scan cell to all unvisited scan cells in the scan chain based on one or more penalty parameters;
    visiting an unvisited scan cell with a minimal distance; and
    repeating the determining, computing, and visiting a plurality of times.

15. The non-transitory computer-readable medium of claim 13, wherein the determining, computing, and visiting are repeated until all scan cells in the scan chain are visited.

16. The non-transitory computer-readable medium of claim 14, wherein the minimizing top-level scan wires and scan feedthroughs further includes:
    automatically updating block-level and top-level scan data based on a sequence of the visiting.

17. The non-transitory computer-readable medium of claim 14, wherein the one or more penalty parameters include at least one of: membership in a plan group or a top-level physical hierarchy, size of a plan group, FLOATING/ORDERED scan element in scan data, location of endpoints of an ORDERED list, location of endpoints of a macro, and membership in a plan group including a STOP point.

18. The non-transitory computer-readable medium of claim 17, wherein when the source scan cell is in a first plan group and an unvisited scan cell is in the first plan group, then the distance is an actual distance between the source scan cell and the unvisited scan cell.

19. The non-transitory computer-readable medium of claim 17, wherein when the source scan cell is in a first plan group and an unvisited scan cell is not in the first plan group, then the distance is an actual distance between the source scan cell and the unvisited scan cell plus a penalty, wherein the penalty is a fraction of a perimeter of the first plan group.

20. The non-transitory computer-readable medium of claim 17, wherein when the source scan cell and an unvisited scan cell are in the top-level physical hierarchy, then the distance is an actual distance between the source scan cell and the unvisited scan cell.

21. The non-transitory computer-readable medium of claim 17, wherein when the source scan cell is in a first plan group and an unvisited scan cell is a first scan cell of an ORDERED list of scan cells located in the first plan group, then the distance is an actual distance between the source scan cell and the unvisited scan cell plus a penalty, wherein the penalty is a fraction of a second distance between the first scan cell and a last scan cell of the ORDERED list.

22. The non-transitory computer-readable medium of claim 17, wherein when the source scan cell is in a first plan group and an unvisited scan cell forms a first scan cell of an ORDERED list, then the distance is an actual distance between the source scan cell and the unvisited scan cell plus a penalty when the first scan cell and/or a last scan cell in the ORDERED list are not in the first plan group.

23. The non-transitory computer-readable medium of claim 17, wherein when the source scan cell is in a first plan group and an unvisited scan cell is in a macro including an embedded scan chain, the macro being located in the first plan group, then the distance is an actual distance between the source scan cell and a scan input of the macro plus a penalty, wherein the penalty is a fraction of a second distance between the scan input and a scan output of the macro.

24. The non-transitory computer-readable medium of claim 17, wherein when the source scan cell is in a first plan group and an unvisited scan cell is in a macro including an embedded scan chain, the macro being located in a second plan group, then the distance is an actual distance between the source scan cell and a scan input of the macro plus a penalty, wherein the penalty is a fraction of a perimeter of the IC.

* * * * *